(12) United States Patent
Mori et al.

(10) Patent No.: US 10,700,259 B2
(45) Date of Patent: Jun. 30, 2020

(54) PIEZOELECTRIC SENSOR AND TOUCH TYPE INPUT DEVICE

(71) Applicant: Murata Manufacturing Co., Ltd., Nagaokakyo-shi, Kyoto-fu (JP)

(72) Inventors: Kenichi Mori, Nagaokakyo (JP); Hidekazu Kano, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 16/356,341

(22) Filed: Mar. 18, 2019

(65) Prior Publication Data

US 2019/0214544 A1 Jul. 11, 2019

Related U.S. Application Data

(63) Continuation of application No. PCT/JP2017/033258, filed on Sep. 14, 2017.

(30) Foreign Application Priority Data

Sep. 21, 2016 (JP) ................. 2016-183599

(51) Int. Cl.
*G06F 3/041* (2006.01)
*H01L 41/193* (2006.01)
(Continued)

(52) U.S. Cl.
CPC ............ *H01L 41/1132* (2013.01); *G01L 1/16* (2013.01); *G06F 3/0414* (2013.01);
(Continued)

(58) Field of Classification Search
CPC .... G06F 3/041; G06F 3/0414; G06F 3/04144; G06F 3/0446; G06F 2203/04105;
(Continued)

(56) References Cited

U.S. PATENT DOCUMENTS 9,864,450 B2 1/2018 Watazu et al.
10,146,392 B2 12/2018 Andoh
(Continued)

FOREIGN PATENT DOCUMENTS

JP 2000337979 A 12/2000
WO 2010143528 A1 12/2010
WO 2014196359 A1 12/2014

OTHER PUBLICATIONS

International Search Report issued in PCT/JP2017/033258, dated Oct. 10, 2017.

(Continued)

*Primary Examiner* — Michael J Eurice
(74) *Attorney, Agent, or Firm* — Arent Fox LLP (57) ABSTRACT

A display device includes a casing (11) an operation plate, a piezoelectric sensor, a controller, and a display. The piezoelectric sensor includes a piezoelectric film, an optically clear adhesive, a plurality of first electrodes, a plurality of first wiring lines, a plurality of second electrodes, a second wiring line, a pair of substrates and a reception circuit. The piezoelectric sensor is bonded to a surface of the operation plate on a side opposite to an operation surface. The plurality of first wiring lines includes a region, which overlaps one of the piezoelectric film and the plurality of second electrodes but does not overlap either the piezoelectric film or the plurality of second electrodes at the same time when a first surface is viewed from a front. The region is provided between the second electrodes when the first surface is viewed from the front.

8 Claims, 9 Drawing Sheets

(51) Int. Cl.
*H01L 41/25* (2013.01)
*H01L 41/113* (2006.01)
*H01L 41/047* (2006.01)
*G01L 1/16* (2006.01)

(52) U.S. Cl.
CPC ........ *G06F 3/04144* (2019.05); *H01L 41/047* (2013.01); *H01L 41/1138* (2013.01); *H01L 41/193* (2013.01)

(58) Field of Classification Search
CPC ....... G01L 1/16; G01L 1/146; H01L 41/1132; H01L 41/1138; H01L 41/193; H01L 41/25; H01L 41/047; H01L 41/0475; H03K 17/964; Y10T 29/42
See application file for complete search history.

(56) References Cited

U.S. PATENT DOCUMENTS

| | | | | |
|---|---|---|---|---|
| 2008/0176042 A1* | 7/2008 | Nashiki | ................... | G06F 3/044 428/172 |
| 2012/0075226 A1* | 3/2012 | Andoh | .................... | G06F 3/046 345/173 |
| 2013/0027339 A1* | 1/2013 | Kodani | .................... | G01L 1/16 345/173 |
| 2013/0082970 A1* | 4/2013 | Frey | ...................... | G06F 3/0414 345/173 |
| 2014/0352440 A1* | 12/2014 | Fennell | .................. | G01N 29/22 73/632 |
| 2014/0354596 A1* | 12/2014 | Djordjev | .............. | G06K 9/0002 345/175 |
| 2015/0046852 A1* | 2/2015 | Furtwangler | ......... | G06F 3/0484 715/762 |
| 2015/0070305 A1* | 3/2015 | Seo | ....................... | G06F 3/0412 345/174 |
| 2016/0117034 A1* | 4/2016 | Day | ..................... | G06F 3/0414 345/174 |
| 2016/0124560 A1* | 5/2016 | Watazu | ............... | H01L 41/0478 345/173 |
| 2016/0364063 A1* | 12/2016 | Wang | .................... | G06F 1/3262 |
| 2017/0199624 A1* | 7/2017 | Nathan | ................. | G06F 3/0414 |
| 2017/0262099 A1* | 9/2017 | Nathan | ................. | G06F 3/0414 |
| 2017/0352797 A1* | 12/2017 | Crowder | ............. | H01L 41/1132 |
| 2018/0055369 A1* | 3/2018 | Burns | .................. | A61B 5/0095 |
| 2018/0326456 A1* | 11/2018 | Park | ...................... | B06B 1/0603 |

OTHER PUBLICATIONS

Written Opinion of the International Searching Authority issued in PCT/JP2017/033258, dated Oct. 10, 2017.

* cited by examiner

| 0.15 | 0.28 | 0.18 |
|---|---|---|
| 0.16 | 0.29 | 0.17 |
| 0.15 | 0.24 | 0.15 |

PIEZOELECTRIC SENSOR AND TOUCH TYPE INPUT DEVICE

CROSS REFERENCE TO RELATED APPLICATIONS

The present application is a continuation of International application No. PCT/JP2017/033258, filed Sep. 14, 2017, which claims priority to Japanese Patent Application No. 2016-183599, filed Sep. 21, 2016, the entire contents of each of which are incorporated herein by reference.

TECHNICAL FIELD

The present invention relates to a piezoelectric sensor including a piezoelectric film, and a touch type input device including the piezoelectric sensor.

BACKGROUND OF THE INVENTION

In recent years, various kinds of piezoelectric sensors including piezoelectric films have been devised. For example, International Publication No. 2010/143528 (Patent Document 1) discloses a piezoelectric sensor including a piezoelectric film made of polylactic acid. The piezoelectric film includes a first surface and a second surface. The piezoelectric sensor further includes four divided electrodes formed on the first surface, four wiring lines connected to the four divided electrodes, and a flat electrode formed on the second surface.

When pressed, the piezoelectric sensor of Patent Document 1 having the above configuration detects voltage generated at each divided electrode from each wiring line. The piezoelectric sensor of Patent Document 1 can output pressing information based on the detected voltage.

However, in the piezoelectric sensor of Patent Document 1, the four wiring lines overlap both the piezoelectric film and the flat electrode. For this reason, in the four wiring lines, voltage is generated from the piezoelectric film in a predetermined region overlapping both the piezoelectric film and the flat electrode. That is, the piezoelectric sensor of Patent Document 1 detects the voltage generated by the four divided electrodes and the predetermined regions of the four wiring lines.

As a result, the conventional piezoelectric sensor and the conventional touch type input device have room for improvement in that the generated voltage is correctly detected by the plurality of divided electrodes.

SUMMARY OF THE INVENTION

An object of the present invention is to provide a piezoelectric sensor and a touch type input device capable of correctly detecting the generated voltage with the plurality of divided electrodes.

According to one aspect of the present invention, a piezoelectric sensor includes: a piezoelectric film including a first surface and a second surface; a plurality of first electrodes opposed to the first surface; a second electrode opposed to the second surface; and a plurality of first wiring lines connected to the plurality of first electrodes. The plurality of first wiring lines include a region, which overlaps one of the piezoelectric film and the second electrode but does not overlap either the piezoelectric film or the second electrode at the same time when the first surface is viewed from a front. That is, even if the plurality of first wiring lines overlap one of the piezoelectric film and the second electrode when the first surface is viewed from the front, the plurality of first wiring lines do not overlap either the piezoelectric film or the second electrodes at the same time.

With this configuration, when the piezoelectric sensor of the present invention is pressed, charges are induced in the first electrode (divided electrode) by charges generated in the piezoelectric film, and voltage is generated in the first electrode 24. On the other hand, charges are not induced in the region by the charges generated in the piezoelectric film.

Thus, the piezoelectric sensor of the present invention can correctly detect voltages generated in a plurality of divided electrodes from the plurality of first wiring lines.

According to another aspect of the present invention, a touch type input device includes the piezoelectric sensor of the present invention.

Thus, the touch type input device of the present invention exerts an effect similar to that of the piezoelectric sensor of the present invention.

The piezoelectric sensor of the present invention can correctly detect the generated voltage with the plurality of divided electrodes. The touch type input device of the present invention can correctly detect the generated voltage with the plurality of divided electrodes.

MODE FOR CARRYING OUT THE INVENTION

First Embodiment

Referring now to the drawings wherein like numerals indicate like elements, there is shown in FIGS. 1-7 a display device 10 constructed in accordance with a first embodiment of the present invention.

Display device 10 includes a box-shaped casing 11, a rectangular operation plate 12, a piezoelectric sensor 13, a controller 20, and a display 30. By way of example, the display device 10 can be a smartphone or a tablet. The operation plate 12 and the piezoelectric sensor 13 constitute a touch panel 100.

The display device 10 is an example of the touch type input device.

The casing 11 is constructed with a frame-shaped side surface and a rectangular bottom surface and includes a rectangular opening. The operation plate 12 abuts the casing 11 so as to close the opening of the casing 11. The operation plate 12 includes an operation surface 101 on which a user performs a touch operation. By way of example, the operation plate 12 can be made of glass.

The controller 20 (FIG. 6) is disposed on an inner bottom surface of the casing 11 and is electrically connected to the piezoelectric sensor 13. The display 30 includes a liquid crystal panel, a polarizing plate, and a backlight. The display 30 is electrically connected to the controller 20.

Hereinafter, a longitudinal direction of the operation surface 101 of the operation plate 12 is sometimes referred to as an X-direction, a short direction of the operation surface 101 of the operation plate 12 is sometimes referred to as a Y-direction, and a thickness direction of the operation plate 12 is sometimes referred to as a Z-direction.

As illustrated in FIGS. 3 to 6, the piezoelectric sensor 13 includes a piezoelectric film 21, an Optically Clear Adhesive (OCA) 23, a plurality of first electrodes 24, a plurality of first wiring lines 124, a plurality of second electrodes 25, a second wiring line 125, a substrate 26, a substrate 27, and a reception circuit 19. The OCA 23 is preferably a transparent adhesive. The piezoelectric sensor 13 is bonded to a surface of the operation plate 12 on a side opposite to the operation surface 101.

The plurality of first electrodes 24 and the plurality of first wiring lines 124 are formed on the surface of the substrate 26 opposed to the piezoelectric film 21. The plurality of first electrodes 24 are preferably made of a conductor film mainly containing, for example, ITO. The substrate 26 is preferably made of a PET resin, a polyimide resin, or the like. In the first embodiment, nine first electrodes 24 are provided. The plurality of first electrodes 24 detect charges (voltage) generated in the piezoelectric film 21.

The plurality of second electrodes 25 and the second wiring line 125 are formed on the surface of the substrate 27 opposed to the piezoelectric film 21. The plurality of second electrodes 254 are preferably made of a conductor film mainly containing, for example, ITO. The substrate 27 is preferably made of a PET resin, a polyimide resin, or the like. In the first embodiment, three second electrodes 25 are provided. The plurality of second electrodes 25 are electrodes that detect charges (voltage) generated in a ground conductor or the piezoelectric film 21.

Figure 3:
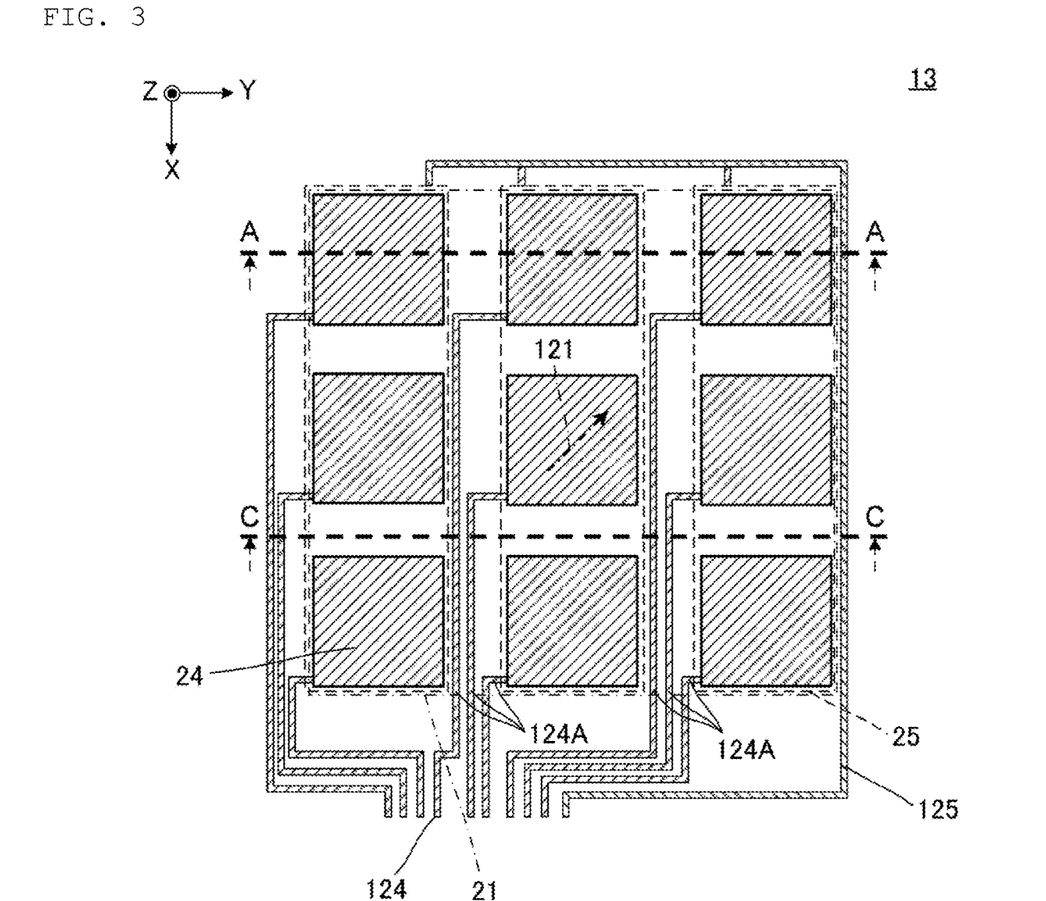
FIG. 3 is a plan view illustrating a piezoelectric sensor 13 in FIG. 1.
Figure 4:
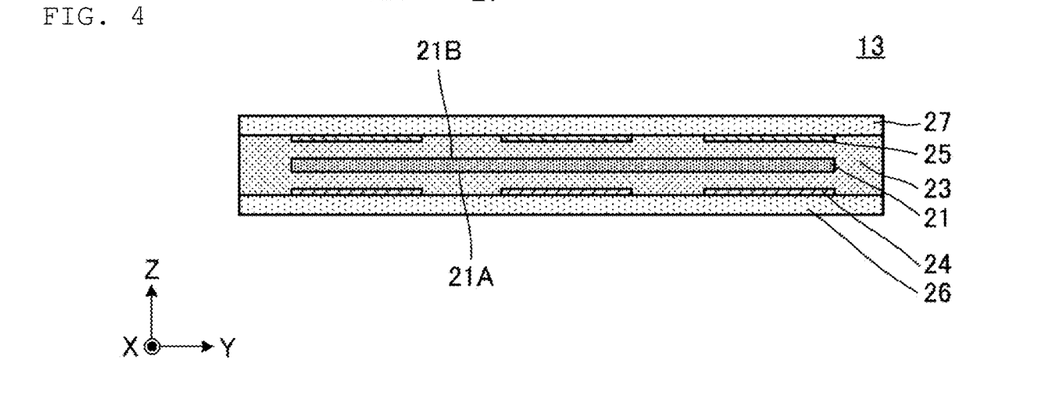
FIG. 4 is a sectional view taken along a line A-A in FIG. 3.

As best shown in FIG. 4, the piezoelectric film 21 includes first and second opposed surfaces 21A and 21B. The plurality of first electrodes 24 are opposed to the first surface 21A of the piezoelectric film 21 with the OCA 23 interposed there between. The plurality of second electrodes 25 are opposed to the second surface 21B of the piezoelectric film 21 with the OCA 23 interposed there between. As best shown in FIG. 3, the plurality of first wiring lines 124 are connected to respective ones of the plurality of first electrodes 24. The plurality of first electrodes 24 are electrically connected to the reception circuit 19 through the plurality of first wiring lines 124. The plurality of second wiring lines 125 are connected to the plurality of second electrodes 25. The plurality of second electrodes 25 are electrically connected to the reception circuit 19 through the second wiring lines 125.

Figure 5:
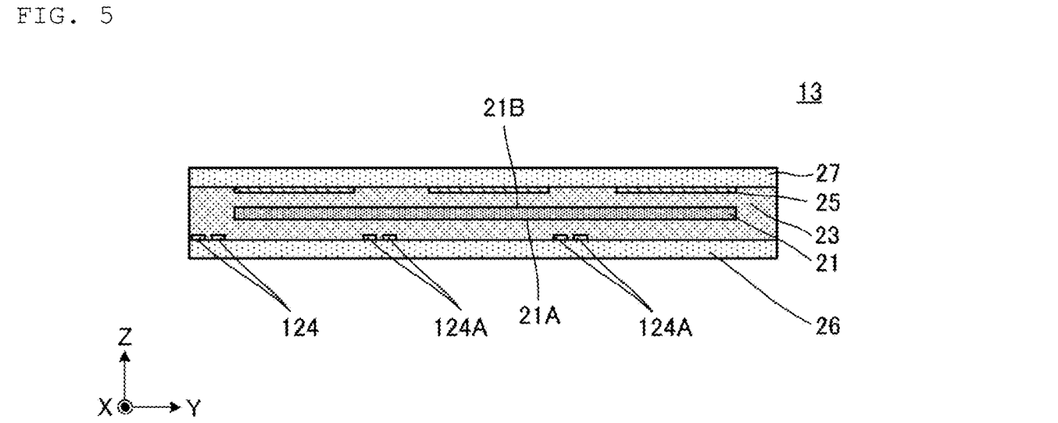
FIG. 5 is a sectional view taken along a line C-C in FIG. 3.

As illustrated in FIGS. 3 and 5, the plurality of first wiring lines 124 include a region 124A which does not overlap both the piezoelectric film 21 and any of the second electrodes 25 at the same time as viewed from a position above the plane of the paper on which FIG. 3 is drawn. The region 124A is provided in the area between the columns of the second electrodes 25 as viewed from a position above the plane of the paper on which FIG. 3 is drawn. As a result, the plurality of first wiring lines 124 do not overlap both the piezoelectric film 21 and one or more of the plurality of second electrodes 25 at the same time in this area. This is clearly shown in the cross section of FIG. 5.

The piezoelectric film 21 is preferably made of L type polylactic acid (PLLA). PLLA is a chiral polymer, and a main chain has a helical structure. PLLA is uniaxially stretched, and has piezoelectricity when molecules are oriented. A piezoelectric constant of uniaxially-stretched PLLA belongs to a very high class among polymers. A material of the piezoelectric film 21 may be a piezoelectric film such as PVDF subjected to poling processing.

In PLLA, the piezoelectricity is generated by orientation processing of molecules by stretching or the like, and there is no need to perform the poling processing unlike other polymers such as PVDF and piezoelectric ceramics. That is, the piezoelectricity of PLLA that does not belong to a ferroelectric substance is not exerted by polarization of ions unlike ferroelectric materials such as PVDF and PZT, but is derived from a helical structure that is a characteristic structure of a molecule.

For this reason, pyroelectricity generated by another ferroelectric piezoelectric material is not generated in PLLA. In the PVDF or the like, a fluctuation in piezoelectric constant is observed over time, and the piezoelectric constant is significantly decreased in some cases. On the other hand, the piezoelectric constant of the PLLA is extremely stable over time.

Assuming that a third axis is taken in a stretching direction 121 of PLLA and that a first axis and a second axis are taken in the directions perpendicular to the third axis direction, a piezoelectric constant d14 (shear piezoelectric constant) exists in PLLA. The stripe-shaped piezoelectric film 21 is cut out such that the first axial direction becomes the thickness direction and such that a direction forming an angle of 45° with respect to the third axis direction (stretching direction 121) becomes the longitudinal direction. Consequently, when expanding and contracting in the longitudinal direction, the piezoelectric film 21 is polarized in the thickness direction.

A scenario where the piezoelectric sensor 13 detects pressing force will be described below.

Figure 7:
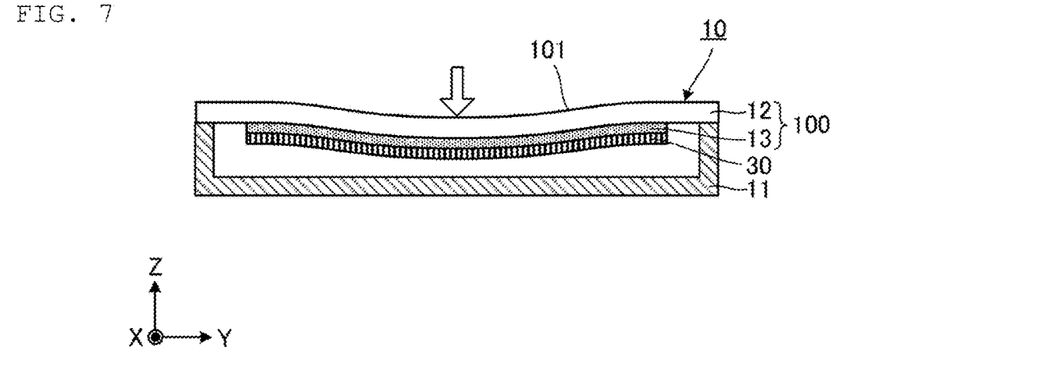
FIG. 7 is a sectional view illustrating a touch panel 100 pressed by a user.

FIG. 7 is a sectional view illustrating the touch panel 100 pressed by the user.

In FIG. 7, the degree of bending is emphasized in order to illustrate a state in which the operation plate 12 and the piezoelectric sensor 13 are bent. The white arrow in FIG. 7 indicates the direction in which the touch panel 100 is pressed by the user.

A peripheral edge of the operation plate 12 is fixed to the casing 11. For this reason, when pressed by the user, the operation plate 12, and with it the piezoelectric sensor 13, is bent so as to be convex in the pressed direction.

As a result, the piezoelectric film 21 constituting the piezoelectric sensor 13 extends (is distorted) in the longitudinal direction (Y-direction). Consequently, the piezoelectric film 21 is polarized in the thickness direction due to a piezoelectric effect.

Charges are thus induced in the plurality of first electrodes 24 and the plurality of second electrodes 25 by the charges generated on both surfaces of the piezoelectric film 21. The charges generated in the plurality of first electrodes 24 and the plurality of second electrodes 25 are output to the reception circuit 19 through the plurality of first wiring lines 124 and the second wiring line 125, respectively.

Figure 6:
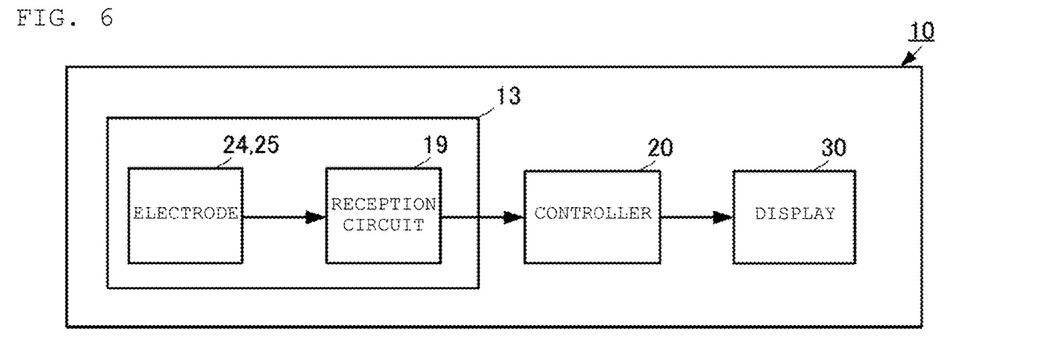
FIG. 6 is a block diagram illustrating a display device in FIG. 1.

Referring to FIG. 6, the reception circuit 19 generates a signal based on outputs from the plurality of first electrodes 24 and the plurality of second electrodes 25 as a pressing force detection signal, and outputs the signal to the controller 20. Specifically, the reception circuit 19 converts impedance, an amplitude level, and the like that are the outputs from the plurality of first electrodes 24 and the plurality of second electrodes 25 into conditions that are easily handled by the controller 20.

The controller 20 performs integration processing on the output of the reception circuit 19. Specifically, the controller 20 determines whether a difference between an output voltage of the reception circuit 19 and a reference voltage exceeds a threshold. When the difference exceeds the threshold, the controller 20 determines that the pressing operation has been performed by the user.

The controller 20 integrates the difference between the output voltage of the reception circuit 19 and the reference voltage with respect to a section where the difference exceeds the threshold. Consequently, the controller 20 obtains an integral value corresponding to a load.

The controller 20 recognizes an operation input content based on the integral value. For example, the controller 20 generates image data based on the recognized operation input content, and outputs the image data to the display 30. The display 30 displays an image on the operation surface 101 based on the image data.

In the above configuration, as illustrated in FIGS. 3 and 5, none of the first wiring lines 124 simultaneously overlap the piezoelectric film 21 and any of the second electrodes 25 when the first surface 21A is viewed from above the plane of the paper on which FIG. 3 is drawn in the area between the columns of second electrodes 25. When the piezoelectric sensor 13 is pressed, charges are induced in the first electrode 24 by the charges generated in the piezoelectric film 21 and a voltage is generated in the first electrode 24. However, charges are not induced in the region 124A of the first wiring lines by the charges generated in the piezoelectric film 21. As a result, the piezoelectric sensor 13 can correctly detect the voltages generated in the plurality of first electrodes 24 from the plurality of first wiring lines 124.

Figure 1:
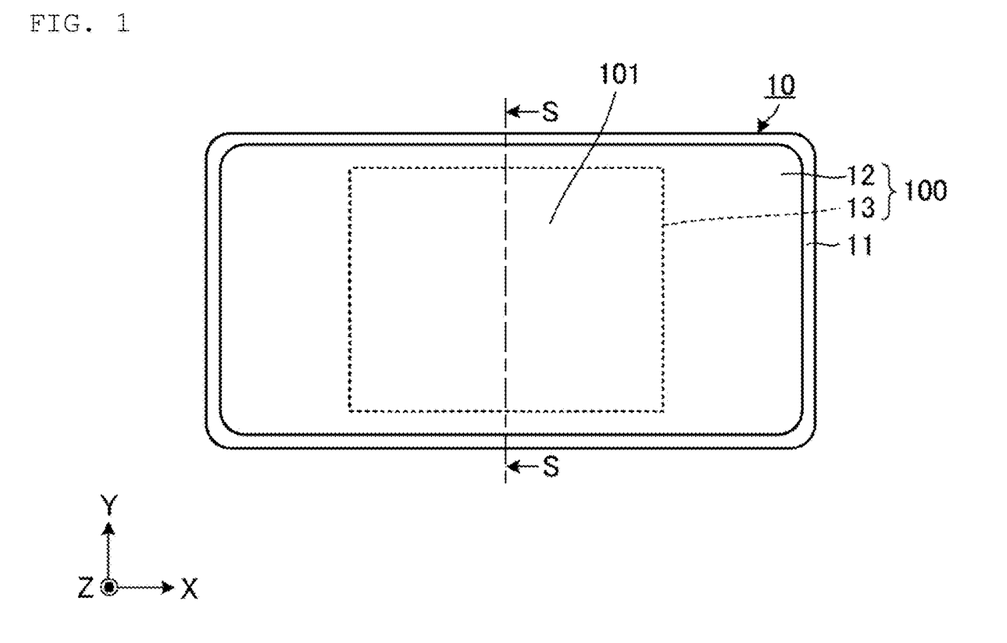
FIG. 1 is a plan view illustrating a display device 10 according to a first embodiment of the present invention.
Figure 2:
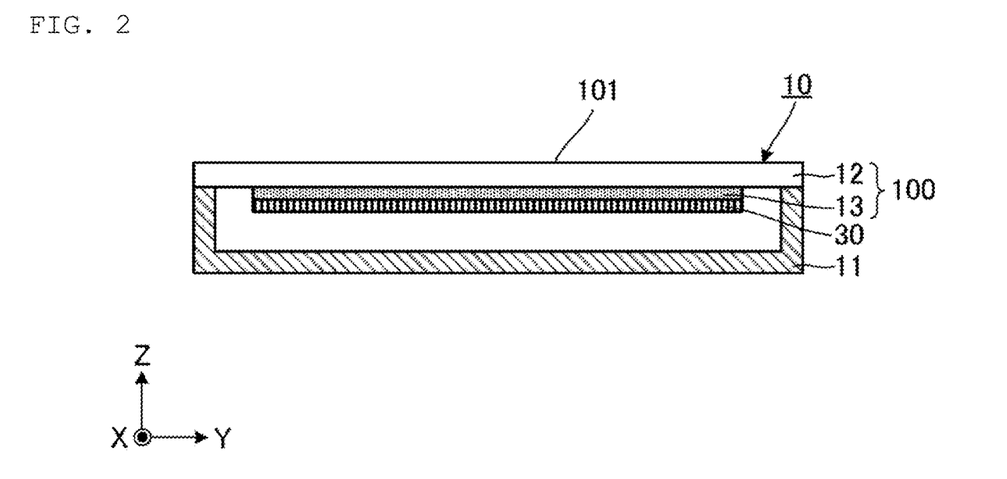
FIG. 2 is a sectional view taken along a line S-S in FIG. 1.

In order to understand some of the advantages of the present invention, the piezoelectric sensor 13 of FIG. 1 will be compared to a piezoelectric sensor 813 (a comparative example). The configuration of the piezoelectric sensor 813 will now be described with respect to FIG. 8.

Figure 8:
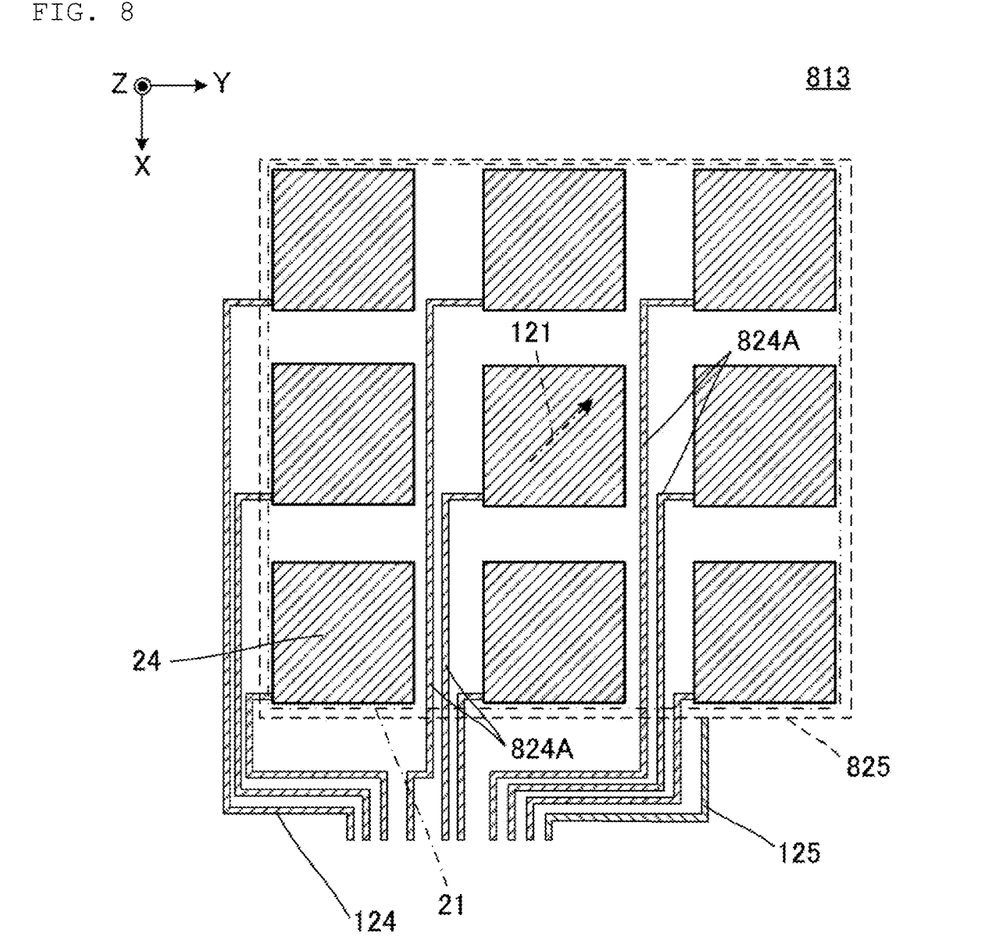
FIG. 8 is a plan view illustrating a piezoelectric sensor 813 according to a comparative example of the piezoelectric sensor 13 in FIG. 1.

FIG. 8 is a plan view illustrating the piezoelectric sensor 813 of a comparative example. The piezoelectric sensor 813 is different from the piezoelectric sensor 13 of the first embodiment in that the plurality of first wiring lines 124 located between the columns of first electrodes 24 (as viewed in FIG. 8) includes a region 824A of the first wiring lines which overlaps both the piezoelectric film 21 and at least one of second electrodes 825 as viewed from a position above the plane of the paper of FIG. 8. That is, the plurality of first wiring lines 124 are disposed so as to overlap both the piezoelectric film 21 and the plurality of second electrodes 25 in the area between the columns of first electrodes 24 as viewed in FIG. 8. when the first surface 21A is viewed from a position. Because the other elements of FIG. 8 and their positions are identical to those of the piezoelectric sensor 13, the description of those elements is omitted.

A voltage value of the piezoelectric sensor 13 in FIG. 1 is compared with a voltage value of the piezoelectric sensor 813 in FIG. 8.

Figure 9:
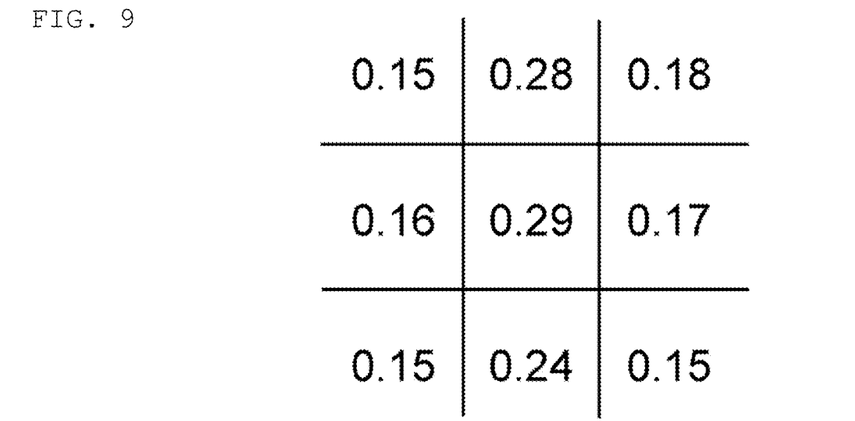
FIG. 9 is a view illustrating a voltage value generated in each first electrode 24 when a center of the piezoelectric sensor 813 in FIG. 8 is pressed.
Figure 10:
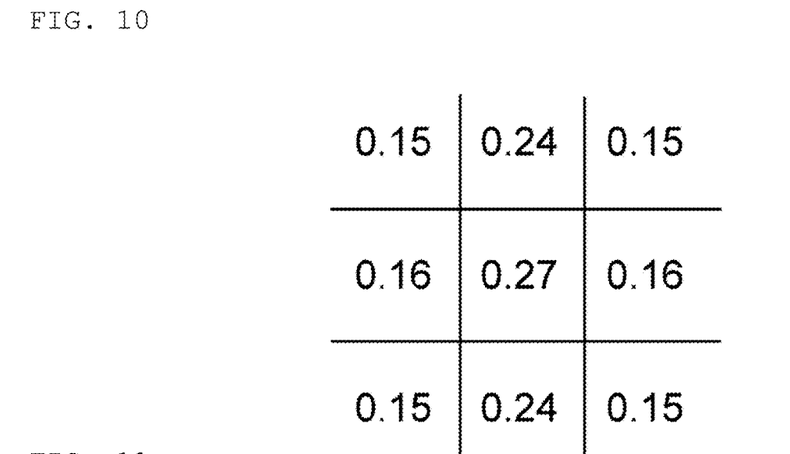
FIG. 10 is a view illustrating the voltage value generated in each first electrode 24 when the center of the piezoelectric sensor 13 in FIG. 3 is pressed.

FIG. 9 is a view illustrating the voltage values generated in nine first electrodes 24 when a center of the piezoelectric sensor 813 in FIG. 8 is pressed with predetermined force. FIG. 10 is a view illustrating the voltage values generated in nine first electrodes 24 when the center of the piezoelectric sensor 13 in FIG. 3 is pressed with predetermined force.

The nine voltage values in FIG. 9 correspond to the nine first electrodes 24, respectively, in FIG. 8. Similarly, the nine voltage values in FIG. 10 correspond to the nine first electrodes 24, respectively, in FIG. 3.

In the piezoelectric sensor 813, as illustrated in FIG. 9, it is clear that the nine voltage values are not vertically and horizontally symmetrically distributed. This is attributed to the fact that a voltage is generated from the piezoelectric film 21 in the region 824A which overlaps both the piezoelectric film 21 and the plurality of second electrodes 25. Because of this, there is a possibility that a position deviated from the pressed center is detected as a pressing position, and it is necessary to correct the voltage in order to improve accuracy. It can also be seen from FIG. 9 that an influence of the wiring electrode is exerted because the large voltage is observed in an upper center and an upper right where the overlapping area of the wiring electrode is large.

In contrast, as illustrated in FIG. 10, it is clear that the nine voltage values in the piezoelectric sensor 13 are vertically and horizontally symmetrically distributed. This is attributed to the fact that the plurality of first wiring lines 124 do not include a region, such as region 824A of FIG. 8, which overlaps both the piezoelectric film 21 and the plurality of second electrodes 25. Consequently, the piezoelectric sensor 13 can correctly detect the pressed center as the pressing position.

Thus, the piezoelectric sensor 13 can correctly detect the voltages generated in the plurality of first electrodes 24 from the plurality of first wiring lines 124.

Second Embodiment

A display device according to a second embodiment of the present invention will be described below.

Figure 11:
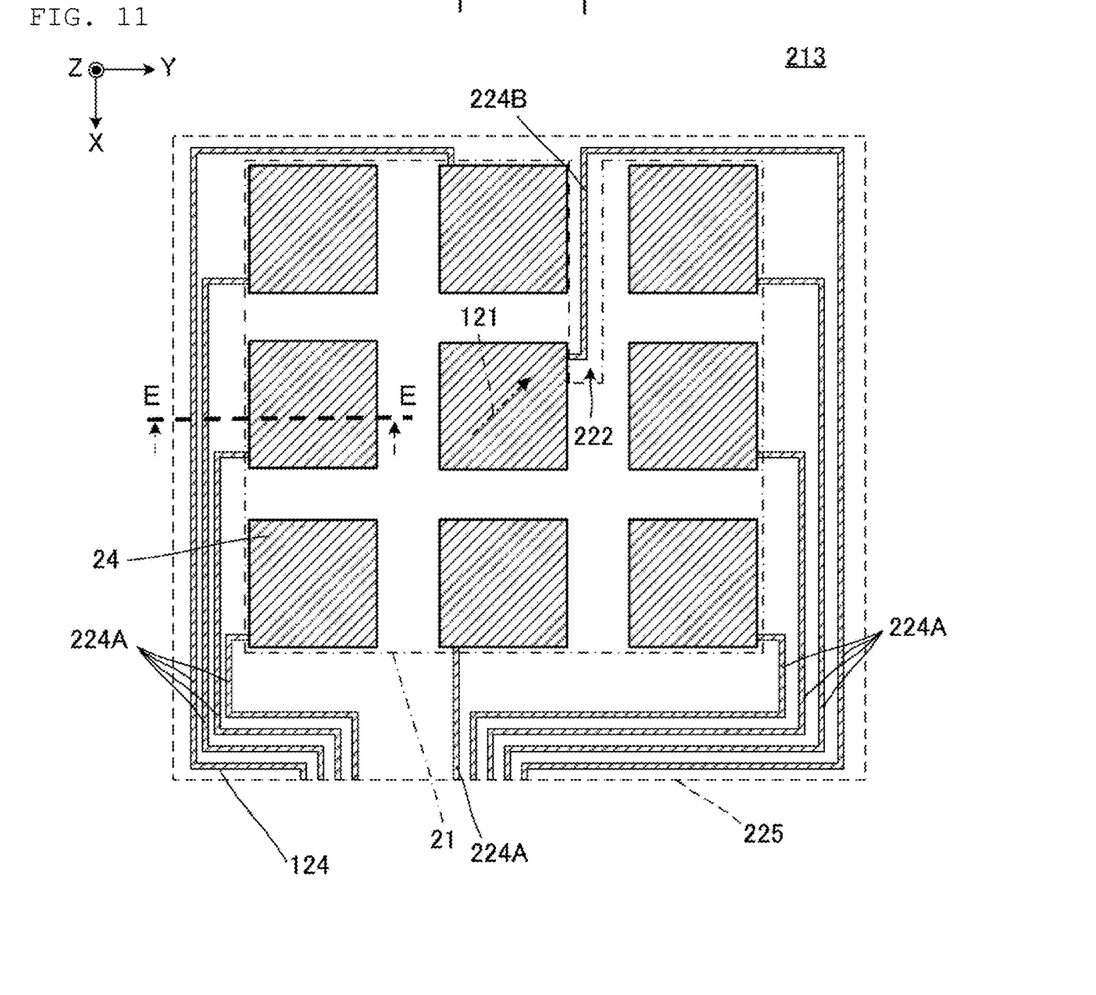
FIG. 11 is a plan view illustrating a piezoelectric sensor 213 included in a display device according to a second embodiment of the present invention.
Figure 12:
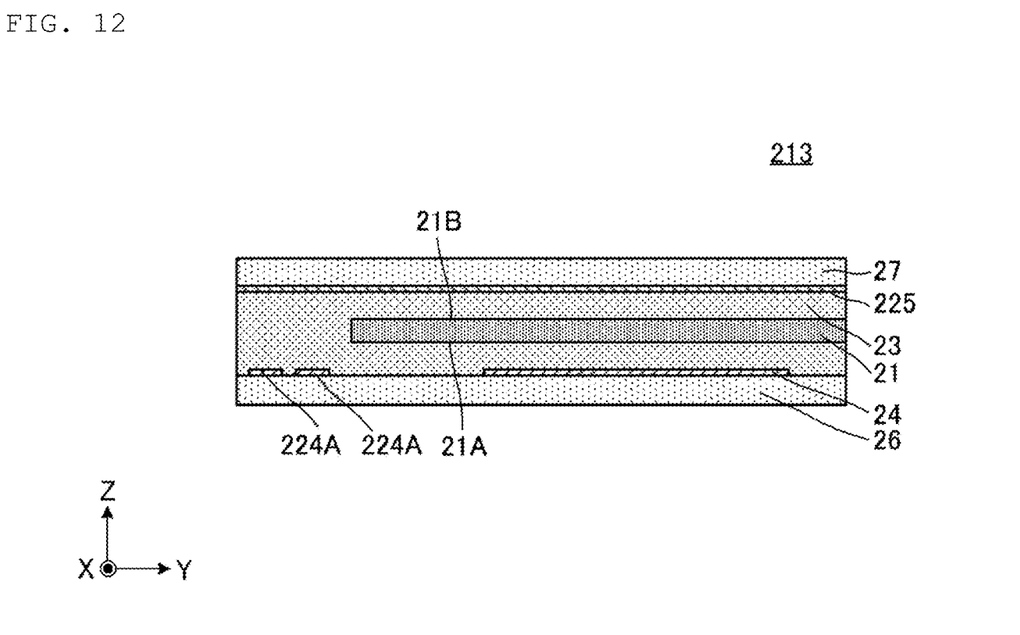
FIG. 12 is a sectional view taken along a line E-E in FIG. 11.

FIG. 11 is a plan view illustrating a piezoelectric sensor 213 included in the display device of the second embodiment of the present invention. FIG. 12 is a sectional view taken along a line E-E in FIG. 11.

The piezoelectric sensor 213 is different from the piezoelectric sensor 13 of the first embodiment in that the plurality of first wiring lines 124 include a region 224A which overlaps either the piezoelectric film 21 or the second electrode 225 but not at the same time. That is, each section of the region 224A of the first wiring lines 124 overlaps either the piezoelectric film 21 or the second electrode 225 as viewed from a position above the plane of the paper on which FIG. 11 is drawn.

In this embodiment, the second electrode 225 is wider than the piezoelectric film 21 when the first surface 21A is viewed from a position above the plane of the paper on which FIG. 11 is drawn. As shown in FIG. 11, the region 224A is located outside the periphery of the piezoelectric film 21, and overlaps the second electrode 225. Because the other configurations of FIG. 11 are identical to those of the piezoelectric sensor 13, the description is omitted.

In the above configuration, as illustrated in FIGS. 11 and 12, none of the first wiring lines 124 both the piezoelectric film 21 and the second electrode 225 in the region 224A. As a result, when the piezoelectric sensor 213 is pressed, the charges are induced in the first electrode 24 by the charges generated in the piezoelectric film 21 and a voltage is generated in the first electrode 24. However, charges are not induced in the region 224A by the charges generated in the piezoelectric film 21. Therefore, the piezoelectric sensor 213 can correctly detect the voltages generated in the plurality of first electrodes 24 from the plurality of first wiring lines 124.

Additionally, there is no need for patterning because the second electrode 225 is a flat electrode. Consequently, manufacturing cost of the piezoelectric sensor 213 can be reduced.

Similarly to a piezoelectric sensor 313 (to be described later) in FIGS. 13 and 14, preferably the piezoelectric film 221 includes a hole or notch 222, and the first wiring lines 124 include a region 224B extending through the area of the hole 222 (i.e., they overlap the hole 22 as viewed from above the plane of the paper on which FIG. 11 is drawn). In this configuration, none of the plurality of first wiring lines 124 simultaneously overlap both the piezoelectric film 21 and the second electrode 225. Thus, in this configuration, the piezoelectric sensor 213 can more correctly detect the voltages generated in the plurality of first electrodes 24 from the plurality of first wiring lines 124.

Third Embodiment

A display device according to a third embodiment of the present invention will be described below.

Figure 13:
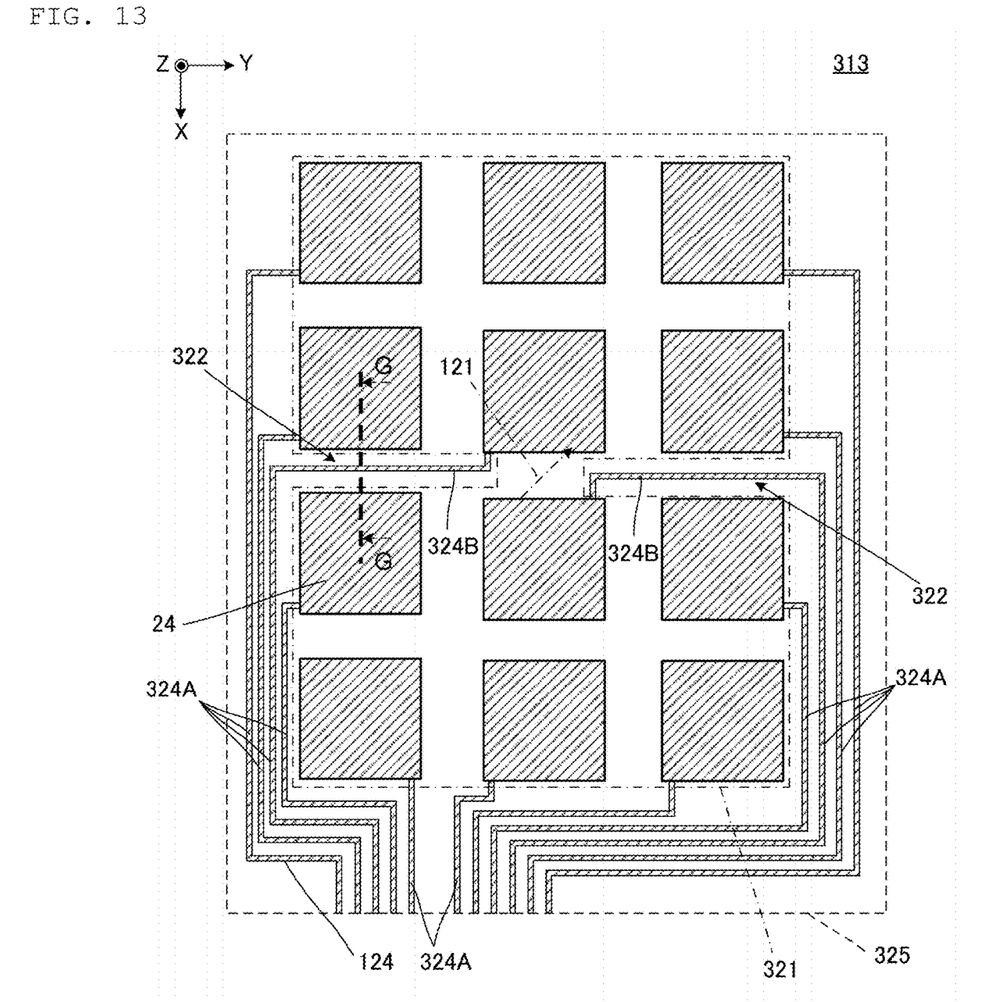
FIG. 13 is a plan view illustrating a piezoelectric sensor 313 included in a display device according to a third embodiment of the present invention.

FIG. 13 is a plan view illustrating a piezoelectric sensor 313 included in the display device of the third embodiment of the present invention. FIG. 14 is a sectional view taken along a line G-G in FIG. 13.

The piezoelectric sensor 313 is different from the piezoelectric sensor 13 of the first embodiment in that the plurality of first wiring lines 124 include regions 324A, 324B, which overlap either the piezoelectric film 321 or the second electrode 325 but do not overlap the piezoelectric film 321 and the second electrode 325 at the same time as viewed from above the plane of the paper on which FIG. 13 is drawn. In this embodiment, the second electrode 325 is wider than the piezoelectric film 321 viewed from above the plane of the paper on which FIG. 13 is drawn. The region 324A is located outside the periphery of the piezoelectric film 321 and overlaps the second electrode 325. A plurality of holes or notches 322 are formed in the piezoelectric film 321, and portions of the region 324B are located in the holes as viewed from a position above the plane of the paper on which FIG. 13 is drawn. Because the other configurations are identical to those of the piezoelectric sensor 13, the description is thereof omitted.

Figure 14:
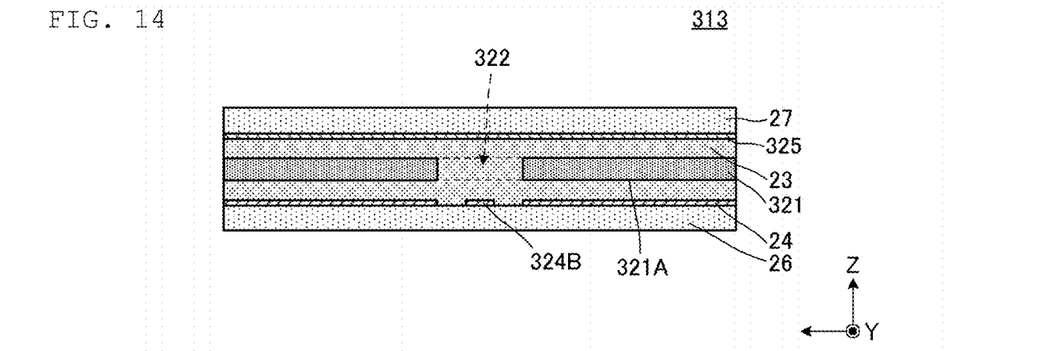
FIG. 14 is a sectional view taken along a line G-G in FIG. 13.

In the above configuration, as illustrated in FIGS. 13 and 14, even though the plurality of first wiring lines 124 overlap either the piezoelectric film 321 or the second electrode 325, the plurality of first wiring lines 124 are disposed so that they do not simultaneously overlap both the film 321 and the second electrode 325 (again, as viewed from above the plane on which FIG. 13 is drawn). When the piezoelectric sensor 313 is pressed, charges are induced in the first electrode 24 by the charges generated in the piezoelectric film 321 and a voltage is generated in the first electrode 24. On the other hand, the charges are not induced in the regions 324A, 324B by the charges generated in the piezoelectric film 321. As a result, the piezoelectric sensor 313 can correctly detect the voltages generated in the plurality of first electrodes 24 from the plurality of first wiring lines 124. Additionally, there is no need for patterning because the second electrode 325 is a flat electrode. Consequently, the manufacturing cost of the piezoelectric sensor 313 can be reduced.

Fourth Embodiment

A display device according to a fourth embodiment of the present invention will be described below.

Figure 15:
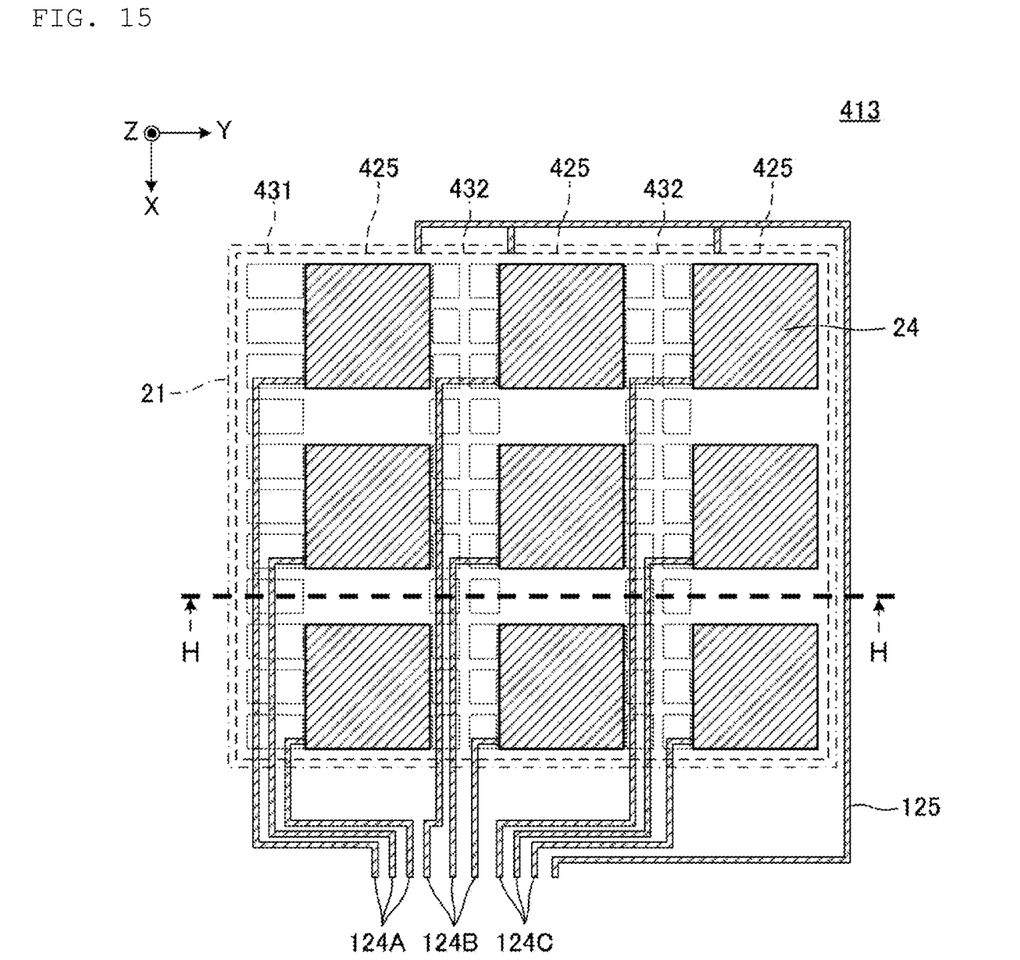
FIG. 15 is a plan view illustrating a piezoelectric sensor 413 included in a display device according to a fourth embodiment of the present invention.
Figure 16:
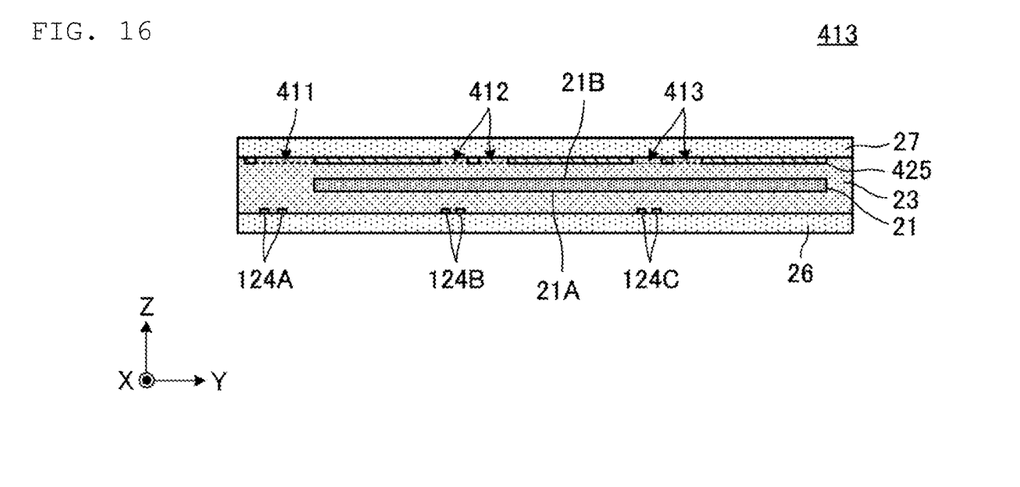
FIG. 16 is a sectional view taken along a line H-H in FIG. 15.
Figure 17:
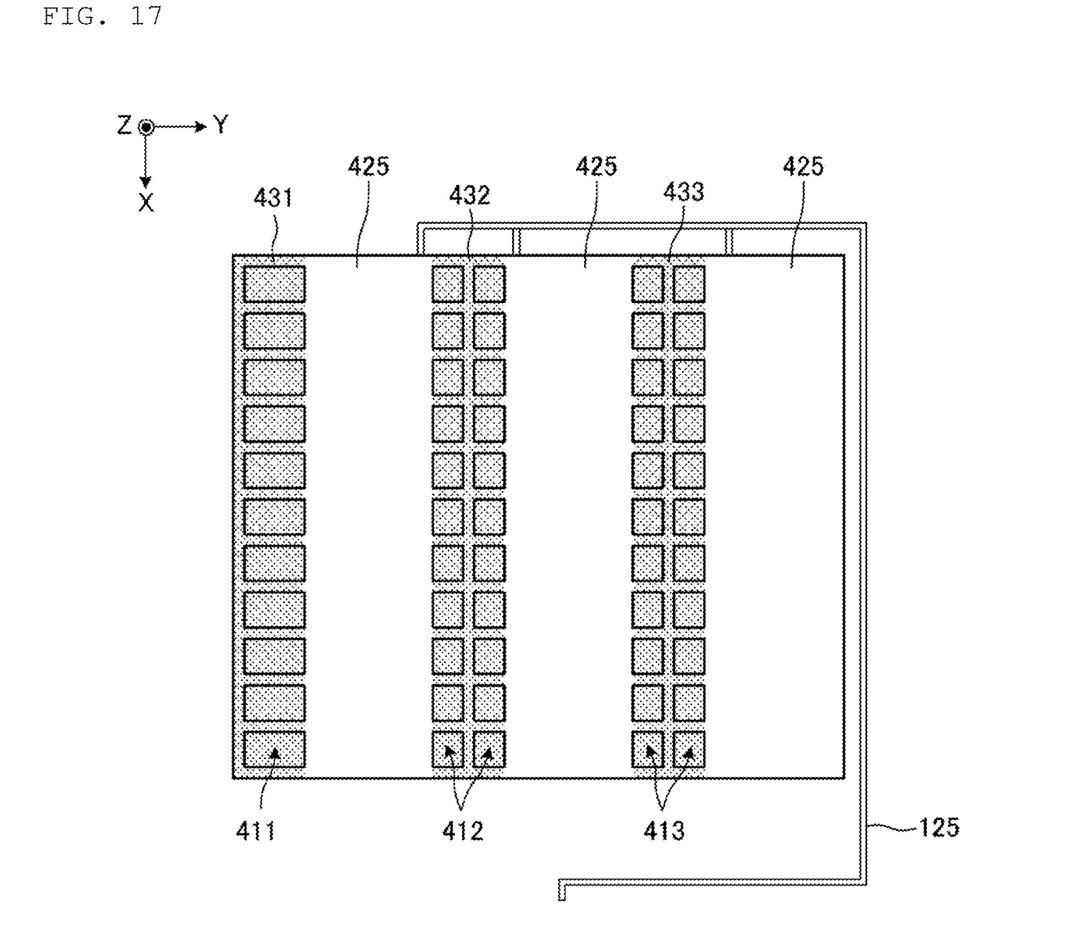
FIG. 17 is a plan view illustrating a second electrode 425 and shield electrodes 431, 432, 433 included in the piezoelectric sensor 413.

FIG. 15 is a plan view illustrating a piezoelectric sensor 413 included in the display device of the fourth embodiment of the present invention. FIG. 16 is a sectional view taken along a line H-H in FIG. 15. FIG. 17 is a plan view illustrating a second electrode 425 and shield electrodes 431, 432, 433 included in the piezoelectric sensor 413. In FIG. 17, the shield electrodes 431, 432, 433 are indicated by a dot pattern for the purpose of easy understanding of the structure.

The piezoelectric sensor 413 is different from the piezoelectric sensor 13 of the first embodiment in that the piezoelectric sensor 413 includes the second electrode 425 and the shield electrodes 431, 432, 433. Because the other configurations are identical to those of the piezoelectric sensor 13, the description is omitted.

The second electrode 425 is a rectangular flat electrode and is substantially identical to that of the second electrode 25 of the first embodiment.

The shield electrodes 431, 432, 433 each include one or more openings and a conductor and each has a conductor density lower than that of the second electrode 425. As best shown in FIG. 17, the shield electrode 431 preferably has a mesh shape and includes a plurality of rectangular openings 411 and the conductor. The shield electrode 432 also preferably has a mesh shape and includes a plurality of rectangular openings 412 and the conductor. Finally, the shield electrode 433 preferably has a mesh shape and includes a plurality of rectangular openings 413 and a conductor.

The conductors of the shield electrodes 431, 432, 433 are connected to the second electrode 425. The openings 411, 412, 413 are preferably through-holes surrounded by the conductor. The conductors of the shield electrodes 431, 432, 433 are preferably made of a conductor film mainly containing, for example, ITO.

As illustrated in FIG. 15, the plurality of first wiring lines 124 are disposed so as to overlap the shield electrodes 431, 432, 433 when the first surface 21A is viewed from a position above the plane of the paper on which FIG. 15 is drawn. That is, the plurality of first wiring lines 124 each include a portion which overlaps the conductors of the shield electrodes 431, 432, 433 and portions located over the plurality of openings 411, 412, 413.

With this configuration, an external noise to the first wiring line 124 is shielded by the shield electrodes 431, 432, 433, so that the influence of the external noise on the plurality of first wiring lines 124 can be prevented (or at least mitigated) even if the piezoelectric sensor 413 is disposed in an environment with a lot of external noises. Thus, a signal-to-noise (SN) ratio based on the outputs from the plurality of first electrodes 24 is improved with this configuration.

Additionally, the shield electrodes 431, 432, 433 have the mesh shape, and the conductor density of the shield electrodes 431, 432, 433 is smaller than that of the second electrode 425. For this reason, substantially no charges are induced in the first wiring lines 124 by the charges generated in the piezoelectric film 21 even if the plurality of first wiring lines 124 simultaneously overlap the piezoelectric film 21 and the shield electrodes (again, as viewed from a position above the plane of the paper on which FIG. 15 is drawn). That is, a voltage is hardly generated in the plurality of first wiring lines 124 due to the charges generated in the piezoelectric film 21. AS a result, the piezoelectric sensor 413 can correctly detect the voltages generated in the plurality of first electrodes 24 from the plurality of first wiring lines 124.

When the first surface 21A is viewed from above (as viewed in FIG. 15), the area where the plurality of first wiring lines 124 and the conductors of the shield electrodes 431, 432, 433 overlap is preferably small. For example, the area of the portion where the plurality of first wiring lines 124 and the conductors of the shield electrodes 431, 432, 433 overlap is less than or equal to 5% of the area of the first electrode 24 (more preferably, less than or equal to 1%). With this configuration, even if the plurality of first wiring lines 124 overlap both the conductor of the shield electrode and the piezoelectric film 21 when the first surface 21A is viewed from a position above the plane of the paper on which FIG. 15 is drawn), there is almost no influence of the voltage generated in the plurality of first electrodes 24 on the detection accuracy (the influence on the detection accuracy is extremely small).

In the case that the shield electrode has the mesh shape, for example, when the first surface 21A is viewed from a position above the plane of the paper on which FIG. 15 is drawn, a line width of the portion where the conductor of the shield electrode overlaps at least the plurality of first wiring lines 124 is preferably less than or equal to a line width of the plurality of first wiring lines 124. With this configuration, even if the plurality of first wiring lines 124 overlap both the conductor of the shield electrode and the piezoelectric film 21 when the first surface 21A is viewed from the front, there is almost no influence of the voltage generated in the plurality of first electrodes 24 on the detection accuracy (the influence on the detection accuracy is extremely small).

In the fourth embodiment, 11 openings 411 are provided, 22 openings 412 are provided, and 22 openings 413 are provided. However, the present invention is not limited to this configuration. The numbers of the plurality of openings 411, 412, 413 may be set to other numbers. The shapes of the plurality of openings 411, 412, 413 are not limited to the rectangular shape. Alternatively, the plurality of openings 411, 412, 413 may have another shape (for example, a circular shape, an elliptic shape, and an L-shape).

In the fourth embodiment, the plurality of openings 411, 412, 413 are the through-hole surrounded by conductor. However, the present invention is not limited to this configuration. For example, the opening may be a notch (slit) extending from a peripheral edge of the conductor toward the inside.

Other Embodiments

In each of the above embodiments, the display device 10 is described as the touch type input device. However, the present invention is not limited to the display device 10. The present invention may be applied to a touch type input device (for example, a touch pad) that does not include the display in the practical use.

In each of the above embodiments, the layers in the piezoelectric sensors 13, 213, 313, 413 are bonded together by the OCA 23 that is the transparent adhesive. However, the present invention is not limited to this configuration. The layers of the piezoelectric sensor 13 may be bonded with a bonding agent in the practical use.

In each of the above embodiments, the number of the plurality of first electrodes 24 is 9 or 12. However, the present invention is not limited to this configuration. The number of the plurality of first electrodes 24 may be set to other numbers in the practical use.

Finally, the description of the above embodiments is to be considered in all respects as illustrative and not restrictive. The scope of the present invention is indicated not by the above embodiments but by the claims. The scope of the present invention includes the scope equivalent to the claims.

DESCRIPTION OF REFERENCE SYMBOLS

10: display device
11: casing
12: operation plate
13, 213, 313, 413: piezoelectric sensor
19: reception circuit
20: controller
21, 221, 321: piezoelectric film
21A, 321A: first surface
21B: second surface
23: OCA
24: first electrode
25, 225, 325, 425: second electrode
26, 27: substrate
30: display
100: touch panel
101: operation surface
121: stretching direction
124: first wiring line
124A, 224A, 224B, 324A, 324B: region
125: second wiring line
222, 322: hole of piezoelectric film
411, 412, 413: opening
431, 432, 433: shield electrode
824A: region

The invention claimed is:
1. A piezoelectric sensor comprising:
a piezoelectric film including first and second opposed planar surfaces;
a plurality of first electrodes opposing the first surface;
a second electrode opposing the second surface; and
a plurality of first wiring lines connected to the plurality of first electrodes, each of the first wiring lines including a respective region which overlaps the piezoelectric film but does not overlap both the piezoelectric film and the second electrode at the same time as viewed from a position above the plane of the first surface of the piezoelectric film.

2. The piezoelectric sensor according to claim 1, wherein:
the second electrode is wider than the piezoelectric film when the first surface is viewed from a position above the plane of the first surface of the piezoelectric film; and
at least one of the regions overlaps the second electrode at a position outside a periphery of the piezoelectric film when the piezoelectric sensor is viewed from the position above the plane of the first surface of the piezoelectric film.

3. The piezoelectric sensor according to claim 1, wherein:
a hole or notch is formed in the piezoelectric film; and
the region of at least one of the first wiring lines is located at a position falling within at least one of the holes or notches when the piezoelectric sensor is viewed from the position above the plane of the first surface of the piezoelectric film.

4. A touch type input device comprising the piezoelectric sensor according claim 1.

5. The piezoelectric sensor according to claim 1, wherein:
the piezoelectric sensor includes a plurality of the second electrodes each of which opposes the second surface of the piezoelectric film; and
each of the regions is located between the second electrodes as viewed from a position above the plane of the first surface of the piezoelectric film.

6. The piezoelectric sensor according to claim 5, wherein:
two of the second electrodes are rectangular in shape and separated by a space located there between; and
at least one of the regions is located in the space.

7. A piezoelectric sensor, comprising
a piezoelectric film including first and second opposed planar surfaces;
a plurality of first electrodes opposing the first surface;
a second electrode opposing the second surface; and
a plurality of first wiring lines connected to the plurality of first electrodes, each of the first wiring lines including a respective region which overlaps one of the piezoelectric film or the second electrode but does not overlap both the piezoelectric film and the second electrode at the same time as viewed from a position above the plane of the first surface of the piezoelectric film, wherein:
a hole or notch is formed in the piezoelectric film; and
the region of at least one of the first wiring lines is located at a position falling within at least one of the holes or notches when the piezoelectric sensor is viewed from the position above the plane of the first surface of the piezoelectric film.

8. A piezoelectric sensor comprising:
(a) a piezoelectric film including first and second opposed planar surfaces;
(b) n sets of first electrodes opposing the first surface, each set of first electrodes comprising a plurality of first electrodes;
(c) n second electrodes, n being an integer greater than one, each of the second electrodes being rectangular in shape and extending parallel to one another to form n−1 adjacent pairs of second electrodes, each adjacent pair of second electrodes having a respective space located there between; and
(d) n−1 sets of wiring lines, each set of wiring lines being associated with both a respective one of the spaces and a respective one of the sets of first electrodes, for each set of wiring lines:
  (i) each wiring line of the respective set being connected to a respective one of the first electrodes of its associated set of wiring lines; and
  (ii) each of the first wiring lines of the respective set including a respective region which overlaps the piezoelectric film but does not overlap both the piezoelectric film and its associated second electrode at the same time as viewed from a position above the plane of the first surface of the piezoelectric film.

* * * * *